(12) United States Patent (10) Patent No.: US 11,902,744 B2
Granados et al. (45) Date of Patent: Feb. 13, 2024

(54) WATERPROOF HEARING AID

(71) Applicants: Jose Granados, Glendale Heights, IL (US); Urudha Patel, Chicago, IL (US)

(72) Inventors: Jose Granados, Glendale Heights, IL (US); Urudha Patel, Chicago, IL (US)

( * ) Notice: Subject to any disclaimer, the term of this patent is extended or adjusted under 35 U.S.C. 154(b) by 96 days.

(21) Appl. No.: 17/734,138

(22) Filed: May 2, 2022

(65) Prior Publication Data

US 2023/0088534 A1 Mar. 23, 2023

Related U.S. Application Data

(60) Provisional application No. 63/246,932, filed on Sep. 22, 2021.

(51) Int. Cl.
*H04R 25/00* (2006.01)
*F26B 9/00* (2006.01)
*H01H 9/16* (2006.01)
*H05K 5/06* (2006.01)

(52) U.S. Cl.
CPC .............. *H04R 25/30* (2013.01); *F26B 9/003* (2013.01); *H01H 9/161* (2013.01); *H04R 25/554* (2013.01); *H04R 25/60* (2013.01); *H04R 25/65* (2013.01); *H05K 5/06* (2013.01); *H04R 2225/025* (2013.01); *H04R 2225/31* (2013.01); *H04R 2225/55* (2013.01); *H04R 2225/61* (2013.01); *H04R 2460/07* (2013.01)

(58) Field of Classification Search
CPC .......... H04R 2225/025; H04R 2225/31; H04R 2225/55; H04R 2225/61; H04R 2460/07; H04R 25/30; H04R 25/554; H04R 25/60; H04R 25/65
USPC ....................................................... 381/322
See application file for complete search history.

(56) References Cited

U.S. PATENT DOCUMENTS 8,885,860 B2 * 11/2014 Djalilian .................. H04R 5/00
381/326
10,462,582 B2 * 10/2019 Neumeyer ........... H04R 25/556

* cited by examiner

*Primary Examiner* — Phylesha Dabney
(74) *Attorney, Agent, or Firm* — Brennan, Manna & Diamond, LLC

(57) ABSTRACT

The present invention relates to a waterproof and trackable hearing aid that can be worn during swimming, bathing, diving and other water activities. The hearing aid is paired with a software application using a wireless channel and can be tracked when lost or goes out of Bluetooth range. The device includes rubber protection for prevention from physical damage and water. A small charging and suction case is used for charging the hearing aid and removing moisture from the hearing aid. The hearing aid is filter-less and can provide amplified sounds to the tympanic membrane of the wearer. The hearing aid includes a solar panel for providing power to the hearing aid device, and can be used for taking calls and listening to music.

20 Claims, 9 Drawing Sheets

WATERPROOF HEARING AID

CROSS-REFERENCE TO RELATED APPLICATION

The present application claims priority to, and the benefit of, U.S. Provisional Application No. 63/246,932, which was filed on Sep. 22, 2021 and is incorporated herein by reference in its entirety.

FIELD OF THE INVENTION

The present invention relates generally to the field of hearing aid devices. More specifically, the present invention relates to a waterproof hearing aid device. The hearing aid device can be used as a pair for both ears and/or as a single device for one ear. The hearing aid includes a charging and suction case for charging the hearing aid and for removing moisture from the hearing aid. A companion software application configures the hearing aid and can be used for tracking the location of the hearing aid. The hearing aid includes a rubber protective barrier around the hearing aid core for preventing physical damage when the device takes a hard hit from the ground if accidentally dropped. Accordingly, the present disclosure makes specific reference thereto. Nonetheless, it is to be appreciated that aspects of the present invention are also equally applicable to other like applications, devices, and methods of manufacture.

BACKGROUND

By way of background, a hearing aid is a battery-powered electronic device designed to improve or assist hearing. The conventional hearing aid is small enough to wear in, or behind an ear. The hearing aid makes some ambient sounds louder (i.e. amplifies) so that a person with hearing problems can clearly hear the ambient sounds. Individuals who are familiar with hearing aids know that hearing aids are typically expensive and buying new hearing aids periodically is not feasible for most consumers.

Users may have trouble wearing conventional hearing aids during certain situations like inclement weather, swimming, and more. When conventional hearing aids are worn by users while being inside water, the hearing aids are generally damaged. Further, it is a great discomfort for individuals to always remove their hearing aids before going for a swim, hot tub soak or taking a bath. To a hearing aid wearer, it is desirable that a hearing aid can be worn under any environmental circumstance.

Conventional hearing aids are dependent upon electrical power supplied from a battery for their operation. This typically requires hearing aids to be kept in a charging case. Individuals desire a hybrid mode of charging where they are not always dependent upon a charging case for charging their hearing aids, especially during travel, remote or outdoor use.

Individuals find it difficult to locate lost hearing aids due to their small size. They have to manually search for the hearing aids, which is not only time-consuming but frustrating. Individuals desire a simple and easy way to locate their lost hearing aids.

Therefore, there exists a long felt need in the art for a hearing aid device that enables individuals to wear the hearing aid device during bathing, swimming or any other water activity. There is also a long felt need in the art for an improved hearing aid device that reduces the chances of damage occurring to hearing aids when introduced to water. Additionally, there is a long felt need in the art for a hearing aid device that does not solely depend upon a charging case for charging. Moreover, there is a long felt need in the art for a hearing aid device that eliminates the need to purchase a new, expensive set of hearing aids due to water damage. Further, there is a long felt need in the art for a hearing aid device that provides an easier way to locate same when lost. Finally, there is a long felt need in the art for a hearing aid that includes a waterproof construction that not only protects from water, but from physical damage that can occur when the hearing aid falls to the ground.

The subject matter disclosed and claimed herein, in one embodiment thereof, comprises a waterproof hearing aid device. The waterproof hearing aid device includes a waterproof rubber layer or barrier protecting the device from water and moisture and from physical damage when the device is accidentally dropped on the ground. The hearing aid device features a solar panel for absorbing solar energy and converting same into electrical energy, a microphone for inputting ambient sound signals to the hearing aid device, a touch panel enabling a user to manually manipulate for controlling a set of functions, a microphone port for receiving sound from the microphone and a sound output port for providing amplified sound to the tympanic membrane of the wearer. The hearing aid device connects to a software application enabling a smartphone application to track the location of the hearing aid and enabling the hearing aid device to receive configuration instructions from the software application.

In this manner, the novel waterproof hearing aid device of the present invention accomplishes all of the forgoing objectives, and provides a relatively safe, durable and waterproof hearing aid that individuals can wear during bathing, swimming or any other water activity without fear of damage. The hearing aid device can be easily tracked using a software application and can be used for music and calls. The solar-powered components and the solar panel provides charging and power that increases the utility and range of the hearing aid. The rubber layer or rubber barrier provides the protection from both water and damage, and thus prohibits repeated purchase of hearing aid devices.

SUMMARY OF THE INVENTION

The following presents a simplified summary in order to provide a basic understanding of some aspects of the disclosed innovation. This summary is not an extensive overview, and it is not intended to identify key/critical elements or to delineate the scope thereof. Its sole purpose is to present some general concepts in a simplified form as a prelude to the more detailed description that is presented later.

The subject matter disclosed and claimed herein, in one embodiment thereof, comprises a waterproof hearing aid device. The waterproof hearing aid device includes a waterproof rubber layer or waterproof barrier for protecting the device from water and moisture, and is designed to provide sound signals to the tympanic membrane of a wearer. The rubber protection is also configured to protect the device from physical damage when the device accidentally falls on the ground. The hearing aid device further comprising a solar panel for absorbing solar energy and converting same into electrical energy, a microphone for inputting ambient sound signals to the hearing aid device, a touch panel enabling a user to manually manipulate for controlling a set of functions, a microphone port for receiving sound from the microphone, and a sound output port for providing amplified sound to the tympanic membrane of the wearer. The hearing aid device further is configured to connect to a software application enabling the smartphone application to track the location of the hearing aid and enabling the hearing aid device to receive configuration instructions from the software application.

In yet another embodiment, the hearing aid device includes an indicator light that flashes in red color when the hearing aid device is lost or is not in Bluetooth range with the other hearing aid device of the pair of hearing aid devices, or not in range of an associated or connected smartphone.

In yet another embodiment, the hearing aid device includes a magnetic side that can be used by a user to attract with a conventional magnet in case the hearing aid device has become unreachable to the hand of the wearer.

In yet another embodiment, the material of the hearing aid device is durable and sturdy diving technology material that can withstand up to fifty pounds per square inch of pressure (i.e. depth of 35 meters or 115 feet) while under water.

In yet another embodiment of the present invention, a combination of a pair of waterproof hearing aid devices and a charging and suction case is defined. The waterproof hearing aid device is designed to be used while swimming, during inclement weather and more. The waterproof hearing aid includes a solar-powered microphone, an indicator light, a wireless module and a touch panel. The charging and suction case includes a pair of slots for receiving the pair of hearing aids, a charging section for charging the received pair of hearing aids and a suction mechanism to remove moisture from the exterior of the waterproof hearing aids, wherein charging and removing moisture take place simultaneously.

In yet another embodiment of the present invention, the suction mechanism can include a dryer that blows dry air on the pair of hearing aids to remove moisture.

In yet another embodiment, the charging case includes a USB charging port for charging the case.

In yet another embodiment, the touch panel detects one manual actuation or two manual actuations wherein the pair of hearing aids are paired to each other on a single manual actuation and a song or music being played is changed when two manual actuations are detected.

In yet another embodiment, a method of tracking a location of a hearing aid is disclosed. The method includes the steps of initially pairing a computer-implemented application installed in a smartphone with the hearing aid using Bluetooth, displaying real-time location of the hearing aid on the application, and displaying a last recorded location of the hearing aid on the application when the hearing aid is not in Bluetooth range with the smartphone.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and are intended to include all such aspects and their equivalents. Other advantages and novel features will become apparent from the following detailed description when considered in conjunction with the drawings.

BRIEF DESCRIPTION OF THE DRAWINGS

The description refers to provided drawings in which similar reference characters refer to similar parts throughout the different views, and in which.

DETAILED DESCRIPTION OF THE PRESENT INVENTION

Figure 1:
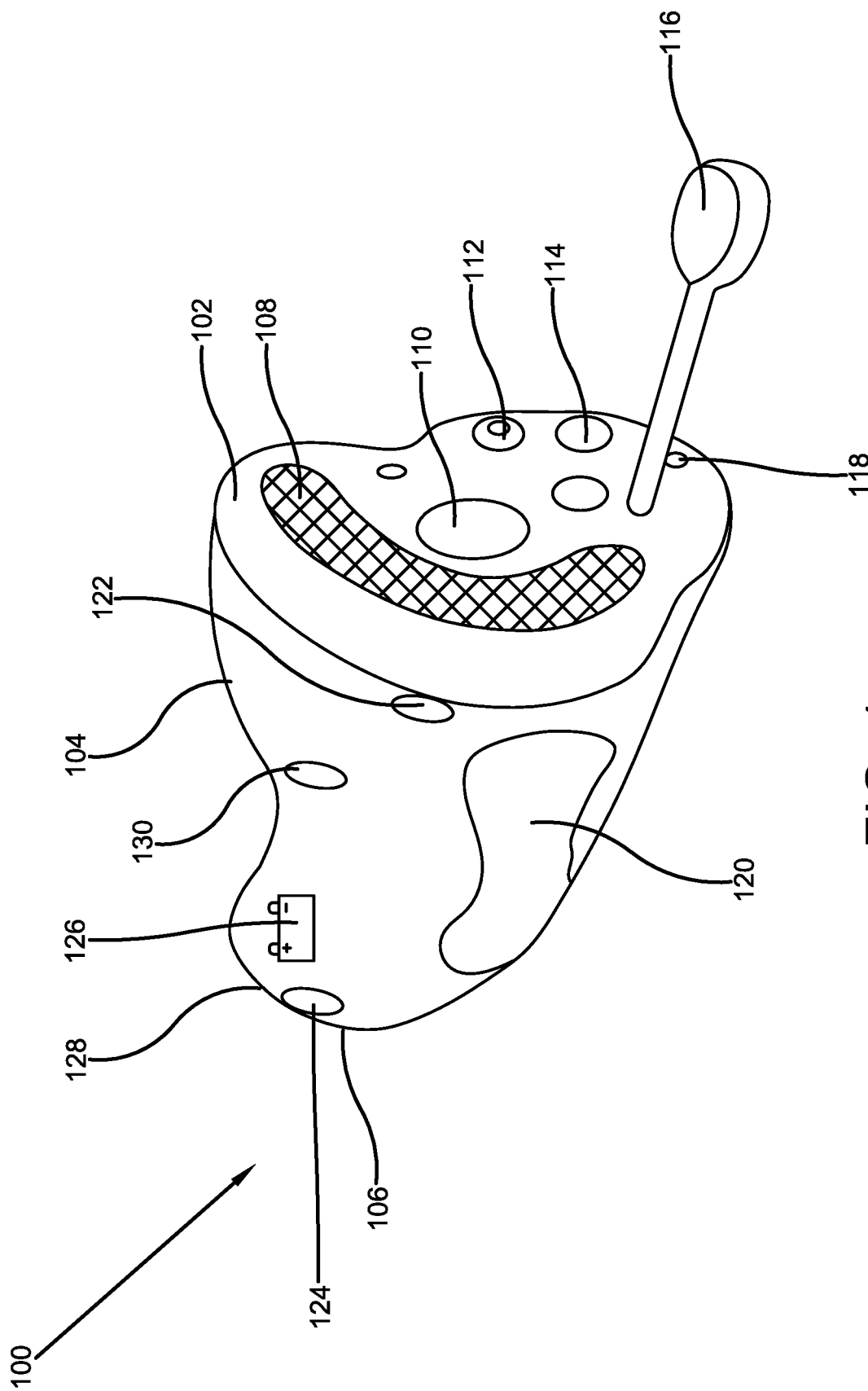
FIG. 1 illustrates a perspective view of one potential embodiment of a waterproof hearing aid device of the present invention in accordance with the disclosed architecture.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof. Various embodiments are discussed hereinafter. It should be noted that the figures are described only to facilitate the description of the embodiments. They are not intended as an exhaustive description of the invention and do not limit the scope of the invention. Additionally, an illustrated embodiment need not have all the aspects or advantages shown. Thus, in other embodiments, any of the features described herein from different embodiments may be combined.

As noted above, there exists a long felt need in the art for a hearing aid device that enables individuals to wear the hearing aid device during bathing, swimming or any other water activity. There is also a long felt need in the art for an improved hearing aid device that reduces the chances of damage occurring to hearing aids when introduced to water. Additionally, there is a long felt need in the art for a hearing aid device that does not solely depend upon a charging case for charging. Moreover, there is a long felt need in the art for a hearing aid device that eliminates the need to purchase a new, expensive set of hearing aids due to water damage.

Further, there is a long felt need in the art for a hearing aid device that provides an easier way to locate same when lost. Finally, there is a long felt need in the art for a hearing aid that includes a waterproof construction that not only protects from water, but from physical damage that can occur when the hearing aid falls to the ground.

The present invention, in one exemplary embodiment, is a novel combination of a pair of waterproof hearing aid devices and a charging and suction case. The waterproof hearing aid device is designed to be used while swimming, during inclement weather and more. The waterproof hearing aid includes a solar powered microphone, an indicator light, a wireless module and a touch panel. The charging and suction/drying case includes a pair of slots for receiving the pair of hearing aids, a charging section for charging the received pair of hearing aids, and a suction mechanism or drying mechanism to remove moisture from the exterior surface of the waterproof hearing aids, wherein charging and moisture removal can take place simultaneously.

Referring initially to drawings, FIG. 1 illustrates a perspective view of one potential embodiment of a waterproof hearing aid device of the present invention in accordance with the disclosed architecture. The waterproof hearing aid 100 of the present invention is a modified hearing aid that is designed to enable hearing-impaired individuals to wear their waterproof hearing aid(s) in inclement weather, water sports, swimming, diving, showering or any other such type of situation. The waterproof hearing aid 100 is manufactured with diving technology materials that can handle over fifty pounds per square inch of pressure (i.e. to a depth of 35 meters or 115 feet) exerted on the device 100 during diving or while under water. More specifically, the hearing aid 100 includes a front-sealed portion 102 and a waterproof shield portion 104. During use and installation in an ear of a user, the front-sealed portion 102 is visually exposed and the ear canal end 106 contacts the ear canal of the user. The ambient sound captured by microphone 116 travels to the ear canal end 106 to reach the tympanic membrane of the user. The waterproof shield portion 104 and the front sealed portion 102 have a sealed rubber protection layer that prevents the hearing aid 100 from being physically damaged when the hearing aid 100 is accidentally dropped on the ground. The rubber layer seals the internal components of the device 100 from water or any other fluid which extends the life of the device 100.

The front-sealed portion 102 includes a small solar panel 108 that is designed to convert absorbed solar power into electrical power for providing power to the components of the waterproof hearing aid 100. The solar panel 108 includes a plurality of waterproof solar cells for absorbing solar energy and converting same into electrical energy. The electrical energy can also be stored in the integrated battery 126 of the device 100.

Figure 6:
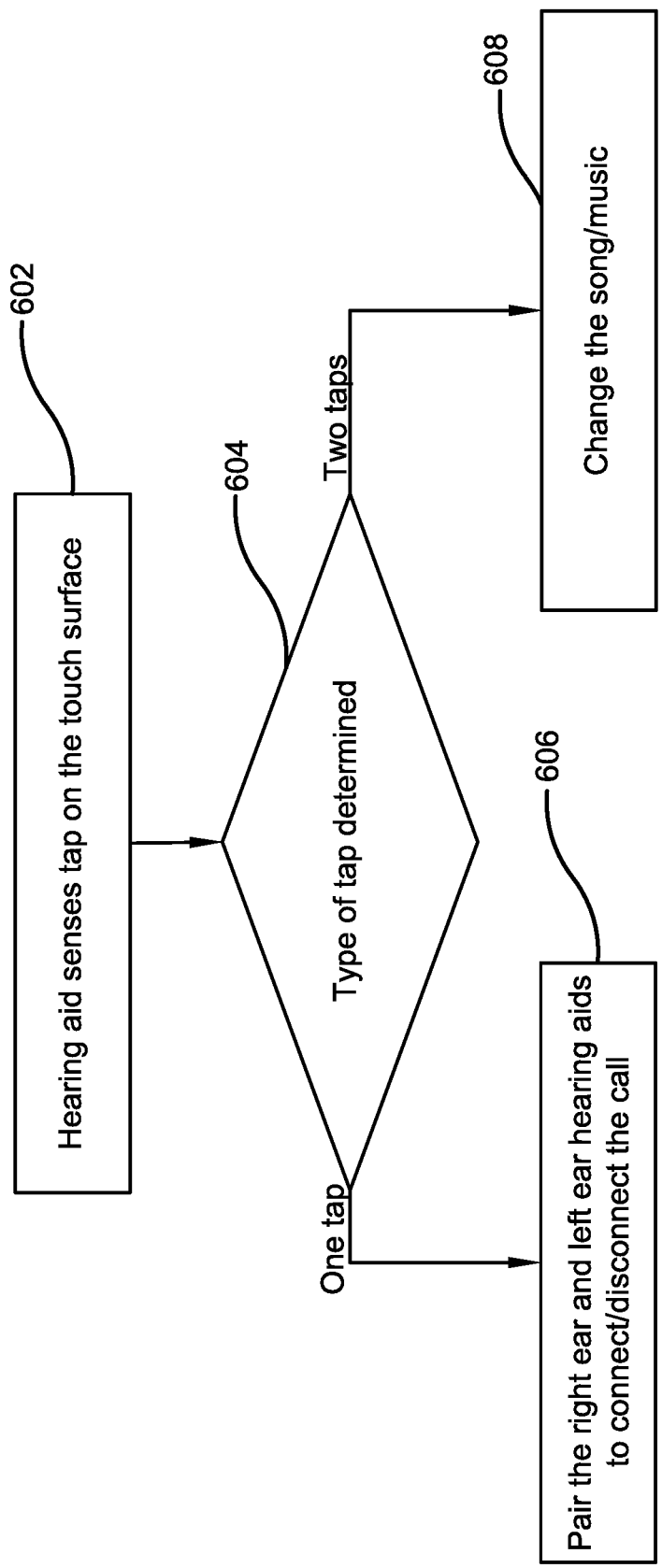
FIG. 6 illustrates a flow diagram showing determination of various types of manual actuations, or 'taps', performed on the waterproof hearing aid of the present invention in accordance with the disclosed architecture.

A touch panel 110 enables a wearer of the hearing aid device 100 to manually manipulate various functions offered by the device 100 as best described in FIG. 6. In one potential embodiment, the device can be manually manipulated on the touch panel 110 for listening to a call from a family member or a friend. Also, the touch panel 110 can enable the user to listen to music and enables the user to change the song with a double 'tap' or manual manipulation. The front-sealed portion 102 includes an activation button or switch 112 that enables the user to activate the drying process of the waterproof hearing aid 100. The activation button or switch 112 can also enable the user to activate the hearing aid 100 after wearing. An indicator light 114 is used for automatic flashing when a pair of hearing aids are separated for more than a threshold range. The threshold range can be a Bluetooth range, for example. In other embodiments, the threshold range can be 10 meters, for example. The front-sealed portion 102 includes a microphone 116 for capturing sound that is passed to the tympanic membrane of the wearer. The hearing aid 100 includes a microphone sound port 122 that receives the ambient sound signals captured from the microphone 116. The hearing aid 100 also includes a sound output port 124 that is close to the eardrum of the human ear, the sound output by the hearing aid can immediately reach the eardrum (tympanic membrane), so that the output gain and waveform are not attenuated, and sufficient sound energy and sound quality fidelity are maintained. The hearing aid 100 also includes an amplifier (not shown) for amplifying microphone sound before reaching the eardrum of the wearer.

Figure 2:
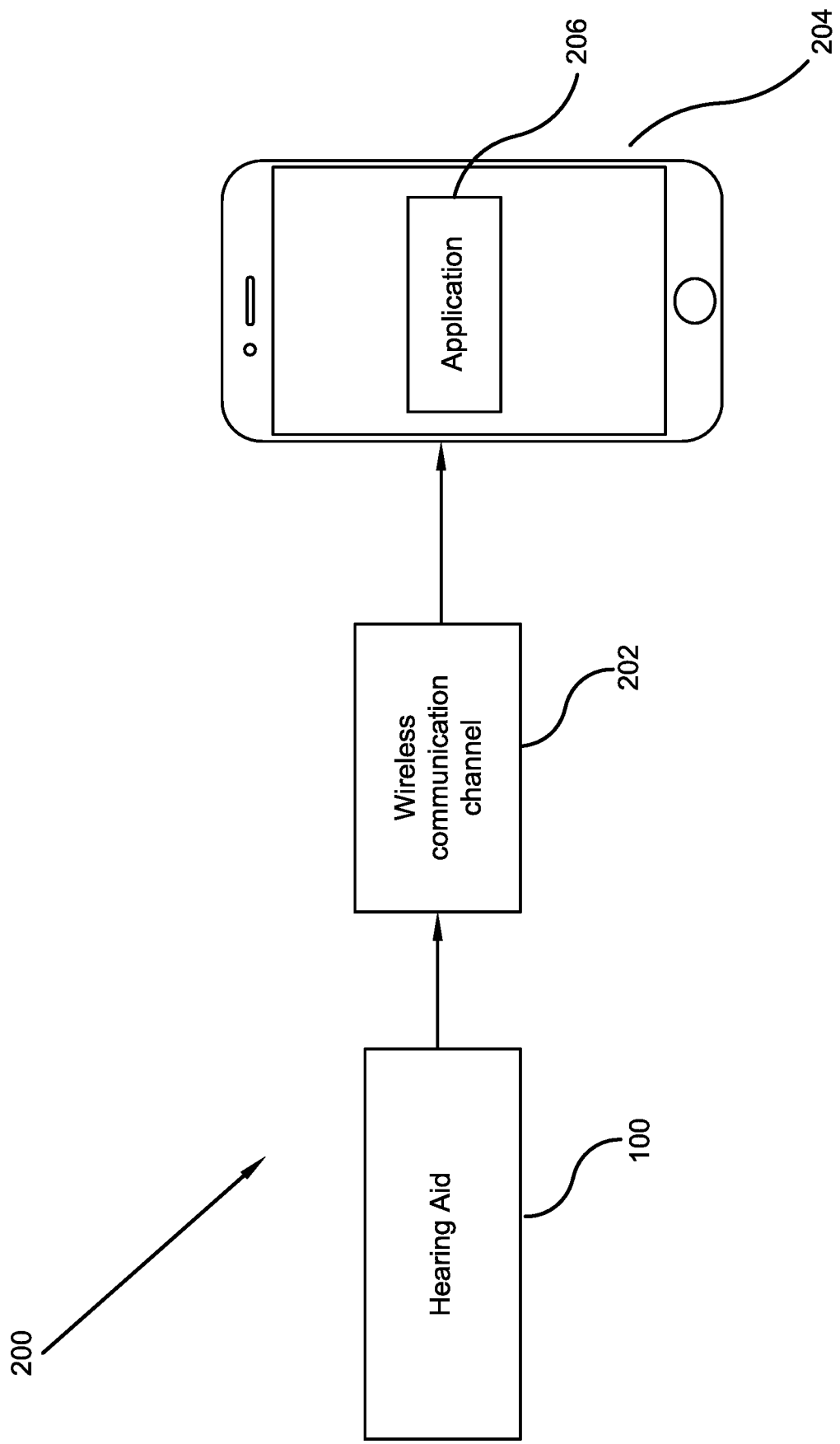
FIG. 2 illustrates a schematic diagram of wireless connection of the waterproof hearing aid of the present invention with a companion smartphone application installed in a handheld electronic device in accordance with the disclosed architecture.

A wireless module 118 enables pairing of the hearing aid 100 with a handheld electronic device such as a smartphone, a mobile phone using a wireless communication medium such as Bluetooth, Wi-Fi or any other similar wireless technology as best shown in FIG. 2. The hearing aid 100 includes a magnetic portion 120 so that the external hearing aid unit can be magnetically-attached to the implanted unit. The magnetic portion 120 includes a ferromagnetic material. The magnetic portion 120 also enables the user to attract the hearing aid 100 using a magnet in cases where the hearing aid 100 is accidentally dropped at a location which is inaccessible by the user's hands and arms.

Figure 4:
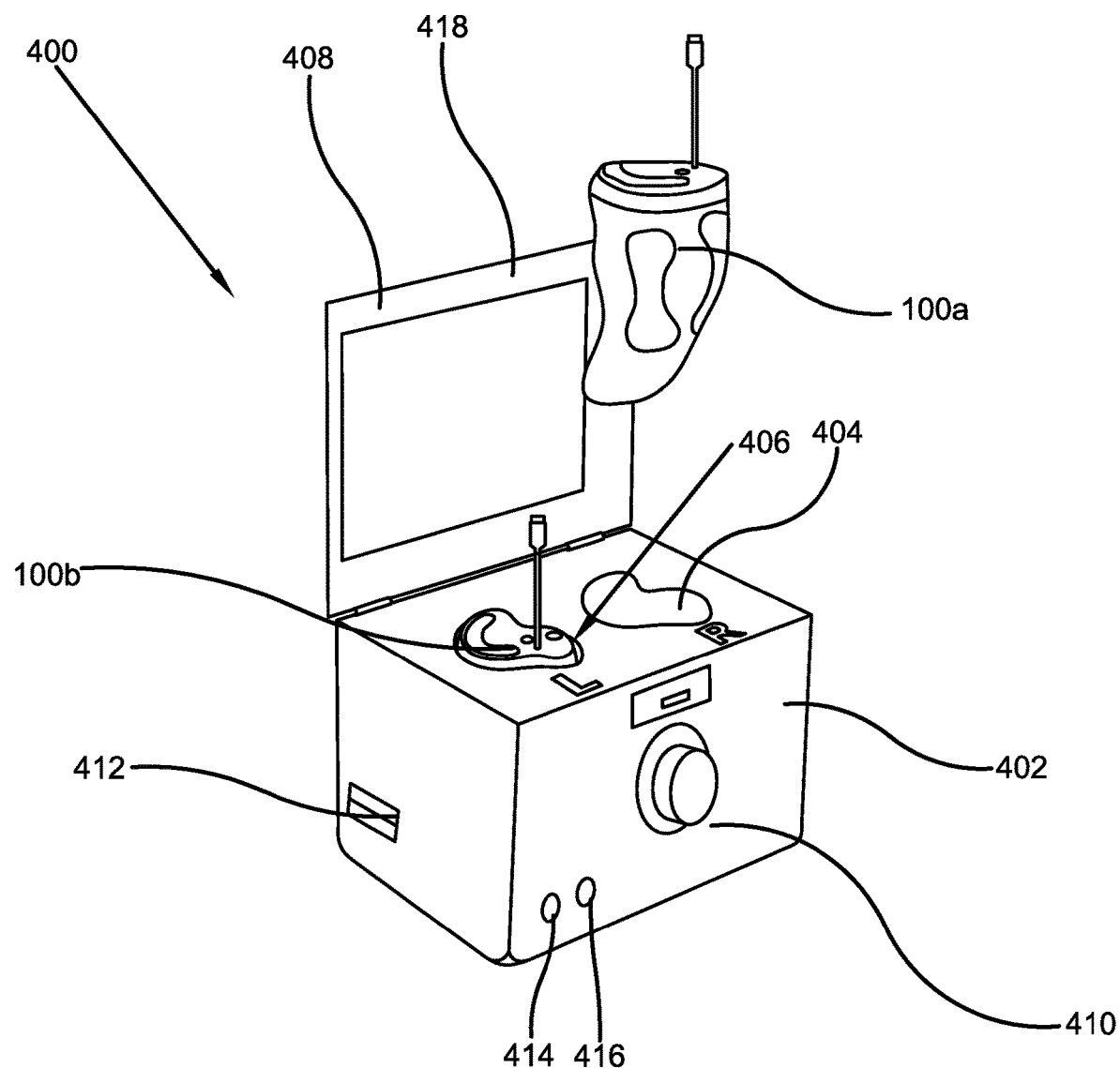
FIG. 4 illustrates a perspective view of the charging and suction case with the hearing aids stored for drying and charging in accordance with the disclosed architecture.

The built-in battery 126 is used for providing power to the mentioned components supra of the hearing aid device 100 and can be charged using the solar panel 108. As an additional means of charging, the hearing aid 100 includes charging pins 128 near the ear canal end 106 that enables charging of the hearing aid 100 when the hearing aid 100 is kept in a charging case as best shown in FIG. 4.

It should be noted that all the electronic components of the hearing aid 100 are connected through one or more wired circuits within the hearing aid 100 and are controlled by processor 130. The wired circuits are insulated and protected from the moisture and water of the swimming pool, lake, shower or other water body/source. Further, the hearing aid 100 is available for both the left ear and right ear and is countered to fit within the ear comfortably and securely.

In one potential embodiment, when ambient sound arrives into the hearing aid 100, the sound is sectioned into bands of sound and digitized before the sound can be amplified before entering the eardrum of the wearer. Further, the hearing aid 100 is filter-less and can provide amplified sounds to the tympanic membrane of the wearer.

FIG. 2 illustrates a schematic diagram of wireless connection of the waterproof hearing aid 100 of the present invention with a companion smartphone application installed in a handheld electronic device in accordance with the disclosed architecture. As shown in FIG. 2, the hearing aid tracking system 200 connects the waterproof hearing aid 100 to at least one handheld electronic device 204 using a wireless communication medium 202 such as Bluetooth, Wi-Fi or any other similar wireless technology. The smartphone device 204 has an installed companion software application 206 that communicates with the paired hearing aid devices 100 and is further configured to receive alerts and notifications from the waterproof hearing aid 100. The smartphone application 206 enables a wearer to register and pair the hearing aid devices 100 that enable the user to track the location of the hearing aid device 100 in order to prevent loss and theft of such devices.

It should be appreciated that hearing-impaired individuals can receive real-time alerts to the hearing aid 100. The Bluetooth functionality of the hearing aid 100 is useful to find and track the location of the hearing aid 100. The alerts or notifications shown on the software application 206 may be in the form of push notifications, audio alerts, or visual alerts.

In the present invention, wireless channel 202 is preferably Bluetooth. Bluetooth technology has the ability to improve the signal-to-noise ratio and eliminate feedback from the microphone 116. Also, the Bluetooth connection experiences less interference during communication. The electronic device 204 can be a wearable device having a display such as a smartwatch.

Figure 3:
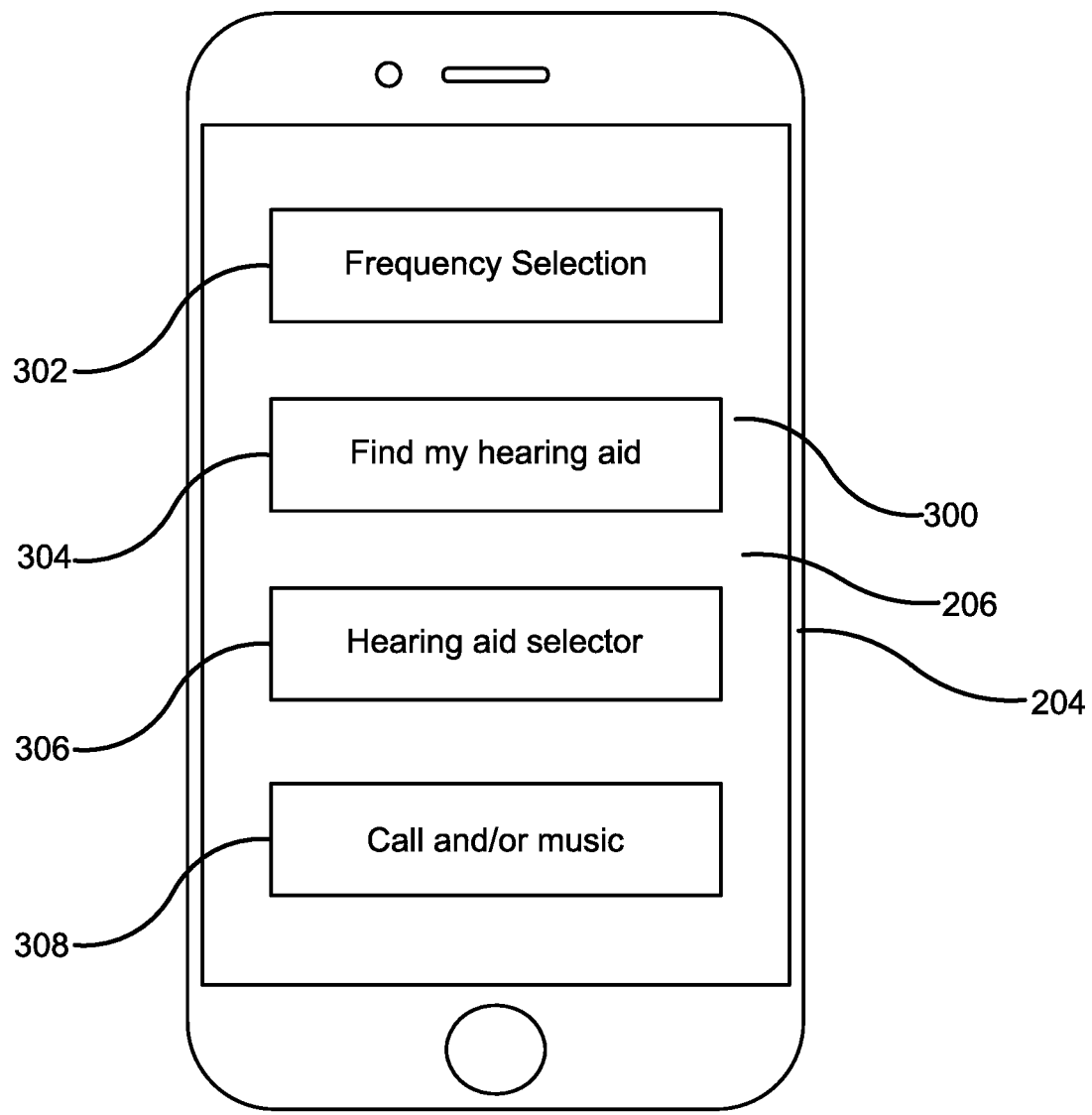
FIG. 3 illustrates an exemplary user interface of the software application installed in the electronic device for controlling and configuring the hearing aid device of the present invention in accordance with the disclosed architecture.

FIG. 3 illustrates an exemplary user interface of the software application 206 installed in the electronic device 204 for controlling and configuring the hearing aid device 100 of the present invention in accordance with the disclosed architecture. The software application 206 enables users to configure the hearing aid device while also enabling the user to determine a location of the hearing aid 100. As shown, the user interface 300 provides a frequency selection button or tab 302 that enables a user to select a specific sound frequency band as per the desire of the wearer. The band can be one or more specific bands within the audible range of human hearing. A unique capability of the present invention is the ability to track a location of the hearing aids using the smartphone application 206. For finding the location of one or both hearing aids, "Find my hearing aid" tab 304 is used. This feature uses Bluetooth connection and the application 206 remembers the last location of the hearing aid devices. Further, the real-time map on the application 206 can show when the wearer with the electronic device 204 in hand is approaching the lost hearing aid device or moving away from same. It should be noted that location technology (such as use of GPS services) can be turned ON (i.e. actuated) for the application 206 to locate the hearing aids. Further, the application 206 needs to continuously run in the foreground or background in the electronic device 204.

In cases, where configuration is to be done for only a left hearing aid or a right hearing aid, the "Hearing aid selector" tab 306 is used. This enables the wearer to selectively configure and selectively locate the left or right hearing aid device. The user interface 300 can pictorially show the left hearing aid device and the right hearing aid device. For playing music and connecting calls, "call and/or music" tab 308 is used, and enables a wearer to play music from the handheld electronic device 204 to the hearing aid devices.

FIG. 4 illustrates a perspective view of charging and suction case 400 with the hearing aids 100a, 100b stored for drying and charging in accordance with the disclosed architecture. The pair of hearing aids 100a, 100b (generally referred as 100 in other embodiments) comes with a charging and suction case 400 that enables a user to store the hearing aids 100a, 100b in the case 400 for charging and drying. The sealed rubber layer or rubber barrier of the hearing aids 100a, 100b can get wet when the hearing aids 100a, 100b are used in water and for drying the water and performing suction, the case 400 is used. More specifically, the case 400 includes a pair of slots 404, 406 in the charging and suction section or base 402 for receiving the pair of hearing aids 100a, 100b. The slots 404, 406 are shaped and contoured so that hearing aid devices for both the left and right ear can be placed in the slots 404, 406. For covering the case when the hearing aids are inserted in the slots 404, 406, a lid 408 is hingedly-connected to the charging section 402.

A knob controller 410 is integrated for controlling the suction and drying level for the hearing aids 100a, 100b. The knob controller 410 controls the dry air and suction provided by the case 400 for the hearing aids 100a, 100b.

The case 400 includes a USB charging port 412 for charging an internal battery (not shown) of the case 400. The internal battery provides power to the hearing aids slotted in the slots 404, 406 and is used in cases where the solar panel (of FIG. 1) is not effective or is not charged. When the case 400 has power and is charging, the hearing aids 100a, 100b, then a first light 414 flashes in a first color such as a green color. When the case 400 has low power, then a second light 416 flashes in a second color such as red color, for indicating the need of charging of the case 400.

For charging the hearing aids 100a, 100b in the charging case 400, the lid 408 can be closed using the locking mechanism 418. When the lid 408 is closed and hearing aids 100a, 100b are slotted, the charging and suction function/mechanism of the case 400 are automatically initiated to remove moisture from the waterproof hearing aids 100a, 100b while charging at the same time (i.e. simultaneously) for a longer period, for example hours, while the hearing aids are not used.

Figure 5:
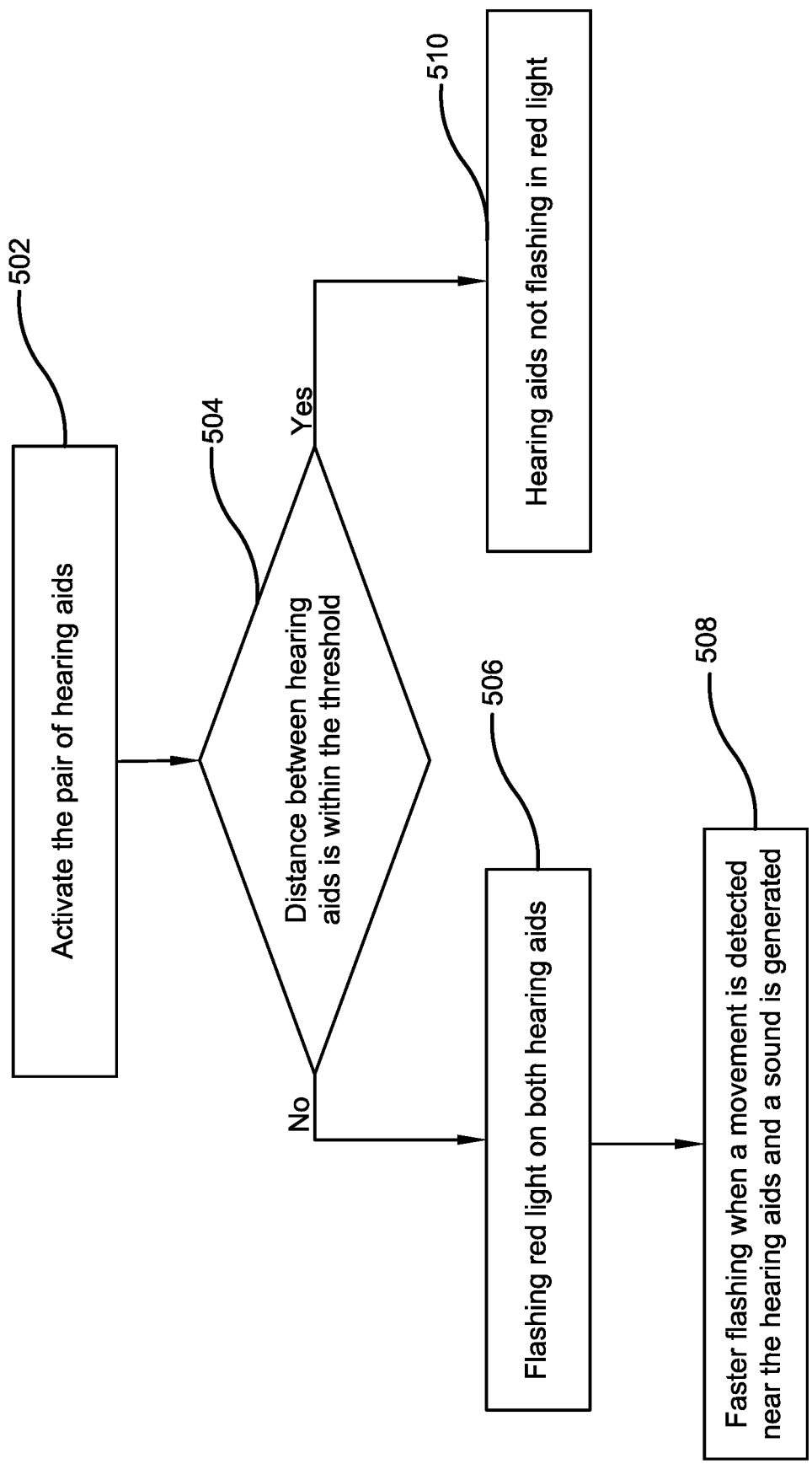
FIG. 5 illustrates a flow diagram showing the process of flashing of light, enabling users to detect hearing aids when lost or separated from each other in accordance with the disclosed architecture.

FIG. 5 illustrates a flow diagram showing the process of flashing of light, thereby enabling users to detect hearing aids when same are lost or separated from each other in accordance with the disclosed architecture. An advantage of the hearing aids of the present invention is that the indicator light 114 of the hearing aids flashes to indicate where they are located. Initially, the pair of hearing aid devices are paired to each other (Step 502). Thereafter, distance between the hearing aid devices is determined to detect if they are in Bluetooth range (Step 504). In situations where the hearing aids are physically close to each other, then the process moves to step 510, and the indicator light is not flashed. However, in case the hearing aids are not physically close and may be outside Bluetooth range, then in step 506 a red light is flashed on both the hearing aids indicating that the hearing aids are out of range and may be lost. When a movement such as of a user or when one of the hearing aids come close to the second hearing aid, then, the red-light flashes faster in the range of 20 to 60 flashes per minute (Step 508). Once the hearing aids are in range, the flashing of the indicator light 114 goes off after 30 seconds, for example.

FIG. 6 illustrates a flow diagram showing determination of various types of manually manipulated (i.e. 'tap') functions performed on the waterproof hearing aid of the present invention in accordance with the disclosed architecture. As shown, initially a wearer manually manipulates functions on the hearing aid device and when the manual selection is detected on the touch panel, the device senses the manual manipulation 602. Then, in step 604, the processor of the waterproof device determines the type of manual selection made on the touch panel. In cases when only a single manual 'tap' is detected, the flow moves to step 606, and the left and the right hearing aid are paired to connect or disconnect a call in order to talk on a call. Further, in step 604, if two quick 'taps' are detected, then, a song or music being played on the hearing aid devices is changed in step 608. It should be noted that music or song is received from a paired electronic device and an instruction is sent from the hearing aid device to the electronic device, when two quick 'taps' are detected by the processor.

Figure 7:
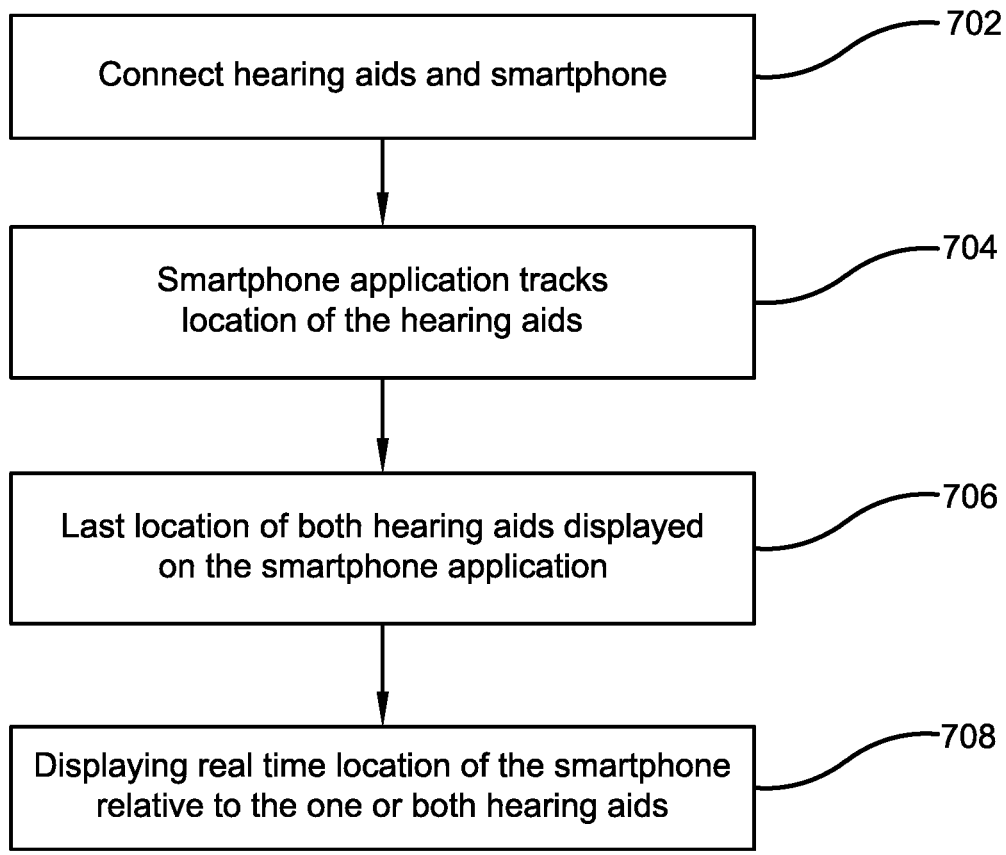
FIG. 7 illustrates an exemplary flow diagram showing steps in tracking a location of the waterproof hearing aid of the present invention using the smartphone application in accordance with the disclosed architecture.

FIG. 7 illustrates an exemplary flow diagram showing steps in tracking location of waterproof hearing aid of the present invention using the smartphone application 206 in accordance with the disclosed architecture. For tracking location of one or both the hearing aids, the smartphone application and the hearing aid devices need to be paired through the wireless communication channel as shown in FIG. 2. So, in step 702, the smartphone application and the hearing aids are paired. Then, the smartphone application running in the background or in the foreground in a handheld electronic device, tracks the location of the hearing aids using Bluetooth connection and GPS functionality of the smartphone in step 704. Thereafter, when one or both of the hearing aids are not located, a last detected location of the hearing aids is displayed on the map section of the smartphone application in step 706. Finally, for locating the lost hearing aids, real-time location of the smartphone relative to the last detected location is displayed on the smartphone application 708.

Figure 8:
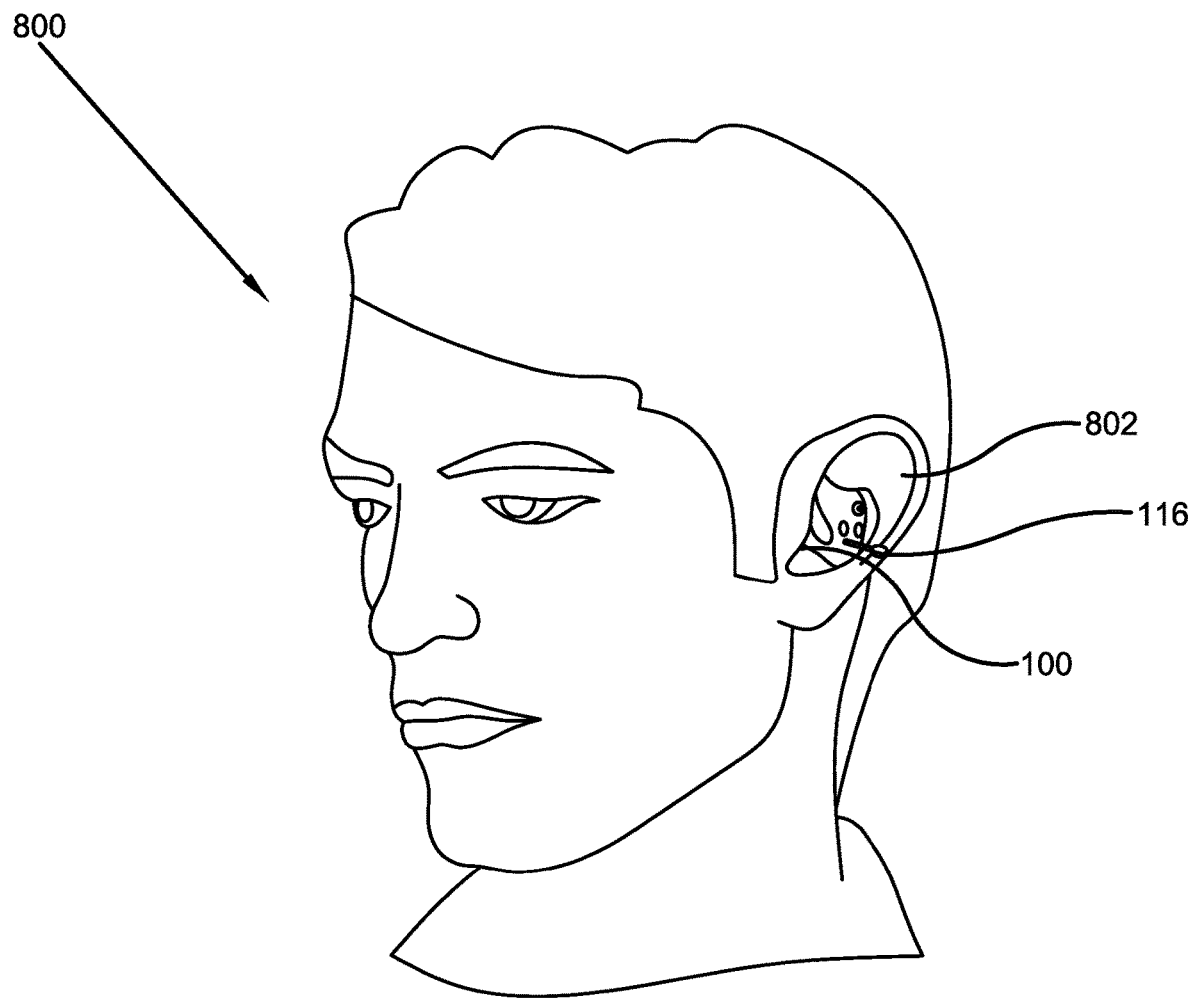
FIG. 8 illustrates a perspective view of a wearer wearing the waterproof hearing aid of the present invention in accordance with the disclosed architecture.

FIG. 8 illustrates a perspective view of a wearer wearing the waterproof hearing aid of the present invention in accordance with the disclosed architecture. The hearing aid 100 is worn inside the ear 802 such that is both secure and comfortable to wear for the wearer 800. It should be appreciated that the hearing aid 100 is made in an irregular manner and matched with the shape of the ear canal of the wearer 800. When the hearing aid 100 is worn by the wearer 800, the front portion 102 is visually exposed but remains inside the ear 802. The microphone 116 can easily capture the ambient sound even when the wearer 800 is in water. The microphone 116 is a waterproof microphone and can be, for example, covered with a layer of waterproof film.

Figure 9:
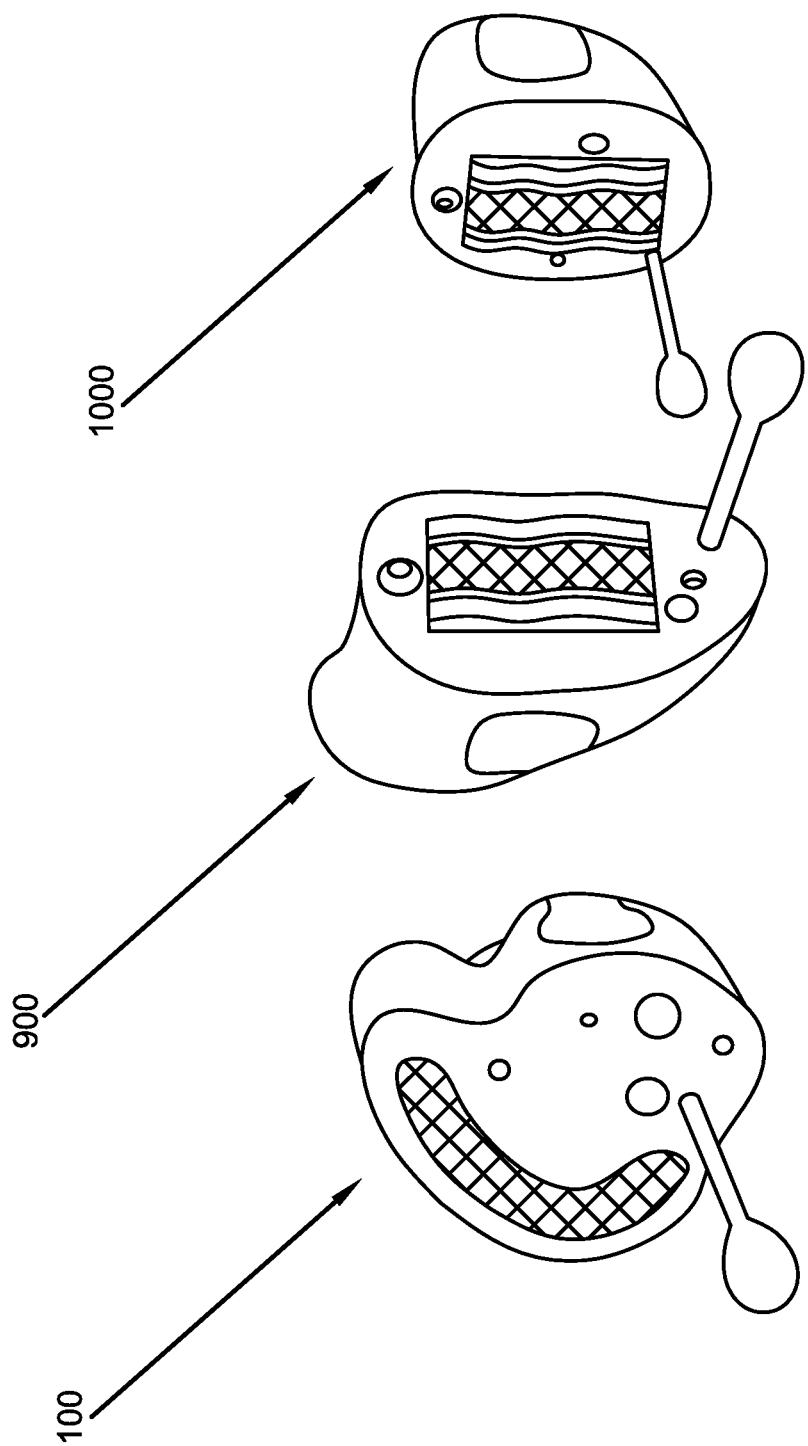
FIG. 9 illustrates a variety of waterproof hearing aids of the present invention embodied in accordance with the disclosed architecture.

FIG. 9 illustrates a variety of waterproof hearing aids of the present invention embodied in accordance with the disclosed architecture. The hearing aid comes in a variety of sizes and colors to fit requirements of users of all ages and genders. As shown, a variety of hearing aids 100,900,1000 are available in the present invention. The features of all the hearing aids are similar as described in various embodiments supra and shown through various figures of the present disclosure.

It should be appreciated that the waterproof hearing aid devices 100,900,1000 can also communicate with a media device, such as a TV or a computer (not shown) and receive the media sound through the Bluetooth so as to achieve better listening performance.

It should be noted that the buttons or tabs on software interfaces and the user interface in various embodiments of the present invention, may also be considered as an independent control unit, but it is not limited thereto.

Certain terms are used throughout the following description and claims to refer to particular features or components. As one skilled in the art will appreciate, different persons may refer to the same feature or component by different names. This document does not intend to distinguish between components or features that differ in name but not structure or function. As used herein "waterproof hearing aid", "waterproof hearing aid device", "hearing aid", "hearing aid device" and "device", are interchangeable and refer to the waterproof hearing aid device 100, 900, 1000 of the present invention.

Notwithstanding the forgoing, the waterproof hearing aid device 100, 900, 1000 of the present invention can be of any suitable size and configuration as is known in the art without affecting the overall concept of the invention, provided that it accomplishes the above-stated objectives. One of ordinary skill in the art will appreciate that the size, configuration and material of the waterproof hearing aid device 100,900,1000 as shown in the FIGS. are for illustrative purposes only, and that many other sizes and shapes of the waterproof hearing aid device 100, 900, 1000 are well within the scope of the present disclosure. Although the dimensions of waterproof hearing aid device 100,900,1000 are important design parameters for user convenience, the waterproof hearing aid device 100, 900, 1000 may be of any size that ensures optimal performance during use and/or that suits the user's needs and/or preferences.

Various modifications and additions can be made to the exemplary embodiments discussed without departing from the scope of the present invention. While the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A waterproof hearing aid device comprising:
   a front sealed portion; and
   an ear canal portion;
   wherein said ear canal portion comprises a waterproof shield;
   wherein said front sealed portion comprises a visually exposed exterior area when said waterproof hearing aid device is in an ear canal of a user;
   wherein said front sealed portion further including a solar panel, a touch panel, a light, and a microphone;
   wherein said solar panel converts solar energy to electrical energy for providing power to said waterproof hearing aid device;
   wherein said touch panel switches a function from a first function to a second function of said waterproof hearing aid device;
   wherein said light is an indicator light for identifying a location of said waterproof hearing aid device; and
   wherein said microphone captures ambient sound for transferring the ambient sound to a sound output port of said ear canal portion.

2. The waterproof hearing aid device of claim 1, wherein said front sealed portion includes a sealed rubber protection layer for prohibiting water from entering said waterproof hearing aid device.

3. The waterproof hearing aid device of claim 1, wherein said ear canal portion includes a battery for storing the electrical energy.

4. The waterproof hearing aid device of claim 1, wherein said first function is a phone call and said second function is music.

5. The waterproof hearing aid device of claim 3, further comprising a charging base for retaining and charging said battery of said waterproof hearing aid device.

6. The waterproof hearing aid device of claim 5, wherein said front sealed portion further includes an activation switch for activating a drying function of said waterproof hearing aid device when mounted in said charging base.

7. The waterproof hearing aid device of claim 5, wherein said indicator light automatically activates when one said hearing aid device is separated from another said waterproof hearing aid device beyond a threshold range.

8. The waterproof hearing aid device of claim 7, wherein said threshold range is a Bluetooth range.

9. The waterproof hearing aid device of claim 8, wherein said sound output port is proximal to a tympanic membrane of the user.

10. The waterproof hearing aid device of claim 8 further comprising a ferromagnetic material.

11. A waterproof hearing aid and charging base system comprising:
- a pair of hearing aid devices;
- wherein each said hearing aid device including a front sealed portion and an ear canal portion;
- wherein said ear canal portion including a waterproof shield;
- wherein said front sealed portion includes a visually exposed exterior area when said hearing aid device is in an ear canal of a user;
- wherein said front sealed portion further including a solar panel, a touch panel, and a microphone;
- wherein said solar panel converts solar energy to electrical energy for providing power to said hearing aid device;
- wherein said touch panel switches a function from a first function to a second function of said hearing aid device;
- wherein said microphone captures ambient sound for transferring the ambient sound to a sound output port of said ear canal portion;
- wherein said ear canal portion includes a battery for storing the electrical energy; and
- a charging base for retaining said pair of hearing aid devices and charging said battery of each said hearing aid device.

12. The waterproof hearing aid and charging base system of claim 11, wherein said front sealed portion includes a sealed rubber protection layer for prohibiting water from entering said hearing aid device.

13. The waterproof hearing aid and charging base system of claim 11, wherein each said hearing aid device includes an indicator light for identifying a location of said hearing aid device.

14. The waterproof hearing aid and charging base system of claim 11, wherein said first function is a phone call and said second function is music.

15. The waterproof hearing aid and charging base system of claim 11, wherein said front sealed portion further includes an activation switch for activating a drying function of said hearing aid device when mounted in said charging base.

16. The waterproof hearing aid and charging base system of claim 13, wherein said indicator light automatically activates when one said hearing aid device is separated from another said hearing aid device beyond a threshold range.

17. The waterproof hearing aid and charging base system of claim 16, wherein said threshold range is a Bluetooth range.

18. The waterproof hearing aid and charging base system of claim 11, wherein said sound output port is proximal to a tympanic membrane of the user.

19. A waterproof hearing aid and charging base system comprising:
- a pair of hearing aid devices;
- wherein each said hearing aid device including a front sealed portion and an ear canal portion;
- wherein said ear canal portion including a waterproof shield;
- wherein said front sealed portion includes a visually exposed exterior area when said hearing aid device is in an ear canal of a user;
- wherein said front sealed portion further including a solar panel, a touch panel, a microphone, and an activation switch;
- wherein said solar panel converts solar energy to electrical energy for providing power to said hearing aid device;
- wherein said touch panel switches a function from a first function to a second function of said hearing aid device;
- wherein said microphone captures ambient sound for transferring the ambient sound to a sound output port of said ear canal portion;
- wherein said ear canal portion includes a battery for storing the electrical energy;
- a charging base for retaining said pair of hearing aid devices and charging said battery of each said hearing aid device; and
- wherein said activation switch for activating a drying function of each said hearing aid device when mounted in said charging base.

20. The waterproof hearing aid and charging base system of claim 19, wherein each said hearing aid device includes an indicator light for identifying a location of said hearing aid device.

* * * * *